(12) United States Patent
Sato

(10) Patent No.: US 6,533,028 B2
(45) Date of Patent: Mar. 18, 2003

(54) HEAT SINK, METHOD OF MANUFACTURING THE SAME, AND COOLING APPARATUS USING THE SAME

(75) Inventor: Kaoru Sato, Kumamoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/916,303

(22) Filed: Jul. 30, 2001

(65) Prior Publication Data

US 2002/0185269 A1 Dec. 12, 2002

(30) Foreign Application Priority Data

Jun. 7, 2001 (JP) .......................................... 2001-172301

(51) Int. Cl.[7] ................................................. H05K 7/20
(52) U.S. Cl. ....................... 165/80.3; 165/185; 361/704
(58) Field of Search ................. 165/80.3, 185; 361/697, 704, 710; 257/719, 722; 174/16.3

(56) References Cited

U.S. PATENT DOCUMENTS 4,823,869 A * 4/1989 Arnold et al. .............. 165/185
5,857,767 A * 1/1999 Hochstein .................. 362/294
6,304,445 B1 * 10/2001 Bollesen .................... 165/80.3
6,382,306 B1 * 5/2002 Hsu ......................... 165/104.26

FOREIGN PATENT DOCUMENTS

| JP | 5-218245 | 8/1993 |
|----|----------|--------|
| JP | 6-9144   | 2/1994 |

* cited by examiner

Primary Examiner—Allen Flanigan
(74) Attorney, Agent, or Firm—Wenderoth, Lind & Ponack, L.L.P.

(57) ABSTRACT

A small and light heat sink having high radiation performance for radiating heat generated from an electronic component, a method of manufacturing the heat sink, and a cooling apparatus employing the heat sink are provided. The heat sink includes a heat conducting plate contacting a heating element to be cooled, and plural columnar fins disposed on the upper surface of the plate. The heat conducting plate has a thickness, in a direction perpendicular to a heat receiving surface, that gradually increases from one end to the other end of the plate. Thermal diffusion from the heating element is thus increased.

29 Claims, 16 Drawing Sheets

Fig. 9A
Fig. 9C
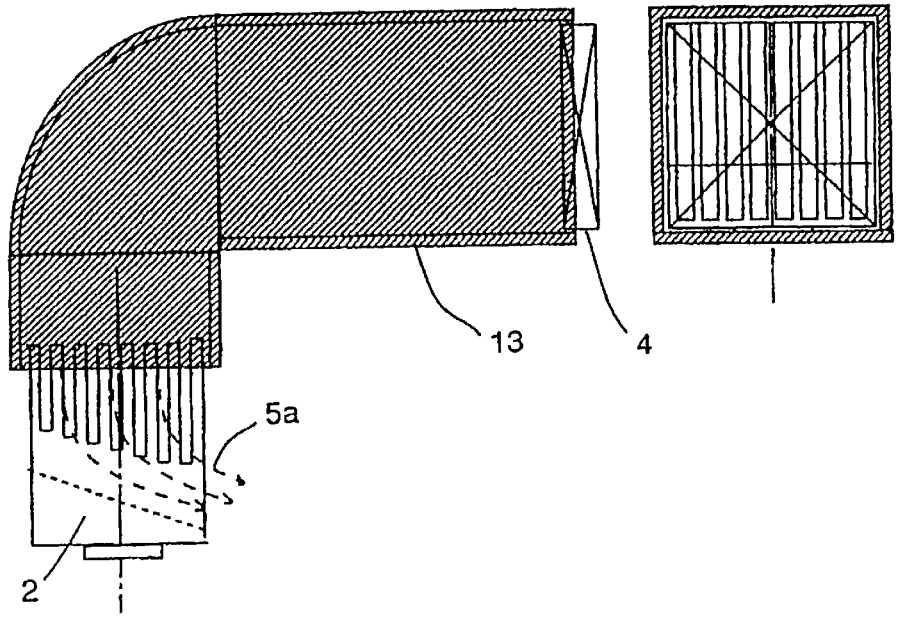
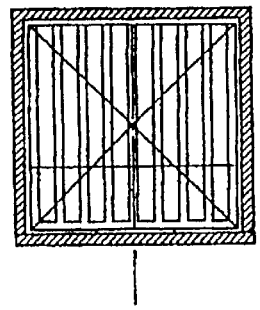
Fig. 9B
Fig. 9D
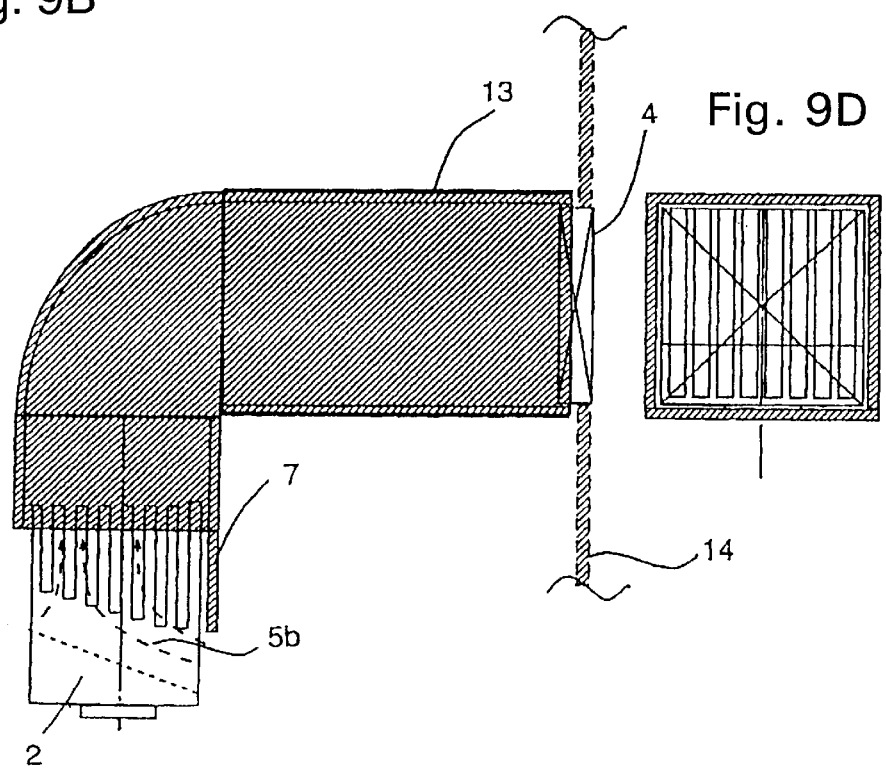
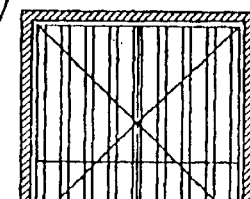

Z-Direction   X-Direction
         Y-Direction

Fig. 15A
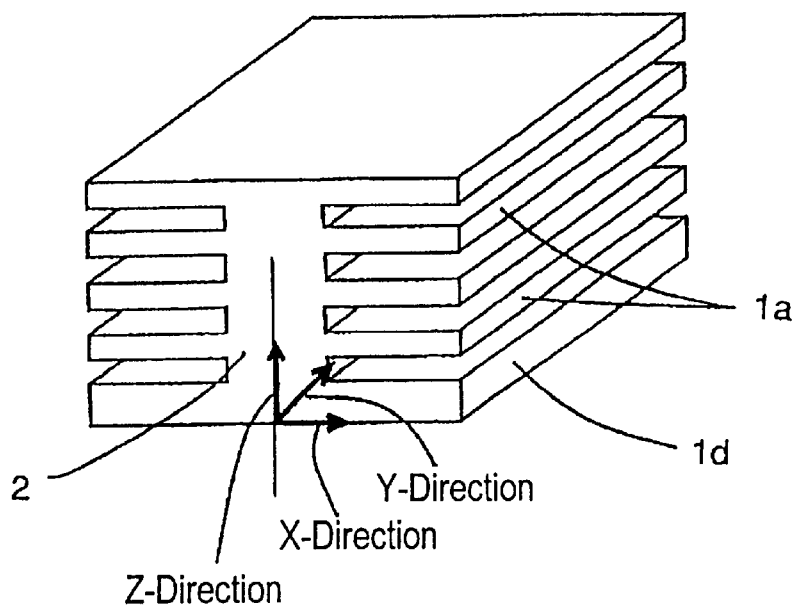
Fig. 15B
Fig. 15C
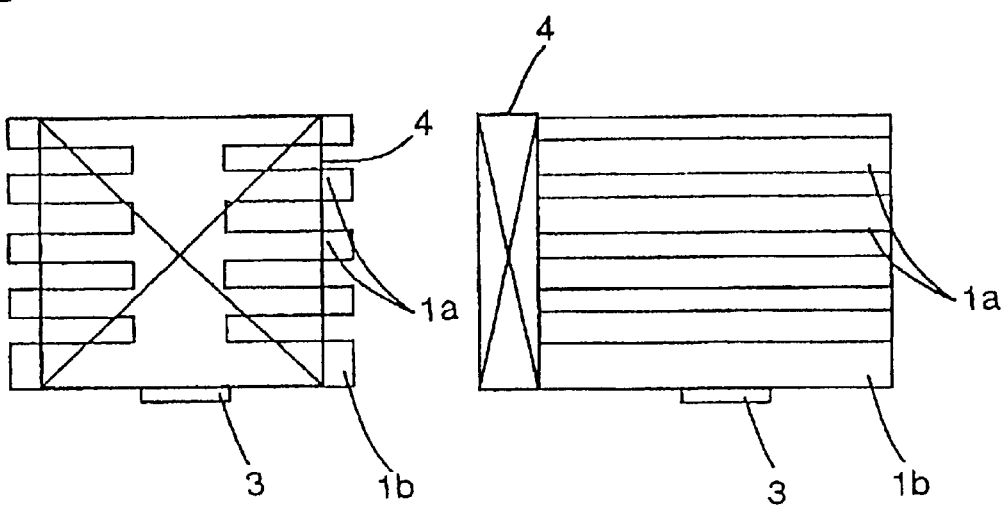

HEAT SINK, METHOD OF MANUFACTURING THE SAME, AND COOLING APPARATUS USING THE SAME

FIELD OF THE INVENTION

The present invention relates to a heat sink for cooling a heating element, e.g. a semiconductor such as an IC, a CPU, or an MPU, or an electronic component having the heating element. The invention also relates to a method of manufacturing the heat sink and to a cooling apparatus including the heat sink and a cooling device like a fan for cooling the heating element.

BACKGROUND OF THE INVENTION

Electronic apparatus have recently generated larger amounts of heat due to having electronic components such as semiconductors integrated at high density and employing operation clocks of high frequency. There has accordingly been concern as to how to maintain an electronic component within an operation temperature range in order to operate normally. The integration of an MPU is drastically enhanced, and a frequency of the MPU is increased. Heat radiation is thus important for stabilizing operation and ensuring an operation life.

A cooling apparatus including a heat sink and a fan having a motor combined generally radiates heat from the electronic apparatus. The heat sink has a larger heat radiation area and efficiently conducts heat to a coolant such as air. The fan forcibly supplies the coolant to the heat sink.

A conventional cooling device will be described hereinafter with reference to FIG. 13A through FIG. 16B.

FIG. 13A and FIG. 13B are perspective views of conventional heat sinks. FIG. 14A and FIG. 14B are a top view and a front view of a conventional cooling apparatus, respectively. FIG. 15A is a perspective view of another conventional heat sink, and FIGS. 15B and 15C are a front view and a side view of another conventional cooling apparatus, respectively. FIG. 16A and FIG. 16B are a front view of the conventional cooling apparatus and a graph showing a heat-radiation performance. Thus, the heat sinks are of various types, including: a plate type heat sink shown in FIG. 13A that includes many plate-like fins 1a, i.e., thin plates, disposed on a base plate 2a constituting a heat conducting unit; a column type heat sink shown in FIG. 13B that includes many columnar fins 1 disposed on a base plate 2a; and a tower type heat sink shown in FIG. 15A that includes many plate-like fins 1a, i.e., thin plates disposed perpendicular to a heat conducting plate 2. These types of heat sinks are mainly made of material such as aluminum or copper having high thermal conductivity, and are manufactured by extrusion molding also called drawing molding), cold forging, die casting, or thin plate laminating. For being mounted to a heating element, the heat sink may be disposed directly on a heating element 3 as shown in FIG. 14C, and a thermal diffusion plate 2c may be disposed between the heating element 3 and the heat sink as shown in FIG. 14B. The thermal diffusion plate 2c conducts heat from the heating element 3 to the heat sink, diffuses the heat, and protects the heating element. In a cooling principle of the cooling apparatus, as shown in FIG. 14B, the heat generated from the heating element is conducted to the columnar fins 1 through the heat conductive base plate 2b made of e.g. aluminum having high thermal conductivity. Then, the heat is further conducted, at the surface of columnar fins 1, to air supplied from the cooling fan 4, diffused into the air.

For an improved performance of the cooling apparatus, the heat is favorably diffused uniformly to an entire heat-conducting unit and radiated from the radiating fins. Regarding the conventional plate-type or column-type heat sink shown in FIG. 13A or FIG. 13B, if the heating element is much smaller than the heat-conducting unit and contacts the heat-conducting unit over a small contacting area, the heat from the heating element is intensively conducted to the radiating fins in the region directly above the heating element, but is relatively hardly conducted to the radiating fins away from such region. Therefore, the radiating fins may not totally function.

When airflow is constant around the radiating fins, radiating capacity increases with an increase of the number of fins and surface area. However, as a total cross-sectional area of the radiating fins in a unit area increases, a part in which air can flow, for example, an air inlet area 18 denoted by oblique lines in FIG. 14A decreases. Total incoming airflow can therefore decrease to degrade radiation performance. In other words, simply increasing number of radiating fins may not improve a cooling effect.

It is most important for the cooling that the heat from the heating element is efficiently conducted to the largest possible range of radiating fins, as discussed above. An improvement in the radiation performance is desired. A tower-type heat sink shown in FIG. 15A, for example, conducts the heat generated from the heating element directly to the upper part of the heat sink through a heat-conducting plate at the center. The heat is diffused in planate by plate fins formed vertically (i.e. perpendicularly to the axis of the heat-conducting plate). The heat diffused in planate from both sides of the thin plate is generally radiated into the air naturally by air cooling.

The conventional cooling apparatus, however, hardly cool an electronic component such as a semiconductor processing at a high speed which generates more heat. A high heating electronic component like an MPU especially cannot perform sufficiently or causes thermal runaway, thereby causing abnormality in the electronic apparatus. The cooling apparatus itself may be relatively enlarged to improve its cooling ability for the increasing heat. However, the size of the electronic apparatus inevitably restricts the size and weight of the cooling apparatus. The tower-type heat sink shown in FIGS. 15A–15C generally includes the heat conducting plate 2 conducting heat from the heating element to each fin more efficiently than the plate-type or column-type heat sink shown in FIGS. 13A and 13B. The tower-type heat sink has a high heat conduction efficiency because of the structure of the heat sink, but tends to stagnate air due to the piled plate fins 1a. A cooling fan is disposed on a side of the tower-type heat sink in consideration of air flow, because simply disposing the cooling fan in the upper part is hardly effective. Even in such a case, the cooling fan is attached to a side of the heat conducting plate in an upright posture in the width direction of the heat conducting plate 2. A section of the heat conducting plate 2 therefore disturbs the air flow from the fan and restricts incoming air flow. Since shaped like plates, the fins hardly provide a sufficient surface area. As a result, even the tower-type heat sink hardly improves heat radiation efficiency totally. It is easily suggested that base plate 2a should be thickened simply in order to improve a thermal diffusion effect of the heat conducting unit in FIG. 14A. However, the unit needs to be rather thick, thereby increasing the weight of the heat sink.

When a cooling fan is disposed on a heat sink as shown in FIG. 16A, sufficient space is required over the cooling fan. However, as electronic apparatuses have been recently downsized, additional structure 19 is often disposed over the cooling fan. Sufficient upper clearance (d) over the fan cannot always be secured. FIG. 16B is a graph showing a relation between heat radiation performance and the clearance over the fan. The vertical axis of this graph represents a ratio of heat radiation performance W/W max (normalized heat radiation performance), and the horizontal axis represents a ratio d/d max (normalized upper clearance) of the clearance over the fan, where W is heat radiation performance corresponding to the clearance (d) over the cooling fan, and W max is a maximum heat radiation performance obtained when heat radiation performance W becomes constant in relation to a gradual increase of clearance (d) over the fan from zero. A clearance obtained at this time is d max. The graph shows that the heat radiation performance declines as the clearance over the cooling fan decreases.

SUMMARY OF THE INVENTION

A small and light heat sink has high radiation performance for radiating heat generated from a heating element, even for a downsized electronic apparatus. A small cooling apparatus employs the heat sink and has high cooling performance. A method of manufacturing an inexpensive heat sink having high performance at a high productivity is further provided.

The heat sink for radiating the heat generated from the heating element includes a heat conducting plate having a heat receiving surface facing the heating element, and plural fins disposed on the upper surface, which is opposite to the heat receiving surface, of a heat conducting plate in non-parallel relation with the heat receiving surface. The heat conducting plate has a thickness that increases from a first end of the heat receiving surface toward a second end opposite to the first end in vertical cross section (i.e. cross section perpendicular to the heat receiving surface).

The cooling apparatus includes the heat sink and a cooling device mounted to the heat sink.

In the method of manufacturing the heat sink, the heat conducting plate and first slits, which define vertical fins therebetween (i.e. fins that are perpendicular to the direction from the first end to the second end of the heat receiving surface) are simultaneously formed.

BRIEF DESCRIPTION OF THE DRAWINGS

FIG. 9A and FIG. 9B are front views and FIG. 9C and FIG. 9D are side views of other cooling apparatuses in accordance with exemplary embodiment 4.

FIG. 15A is a perspective view of another conventional heat sink, and FIGS. 15B and 15C are a front view and a side view of another conventional cooling apparatus.

DESCRIPTION OF THE PREFERRED EMBODIMENTS (Exemplary Embodiment 1)

Figure 1A:
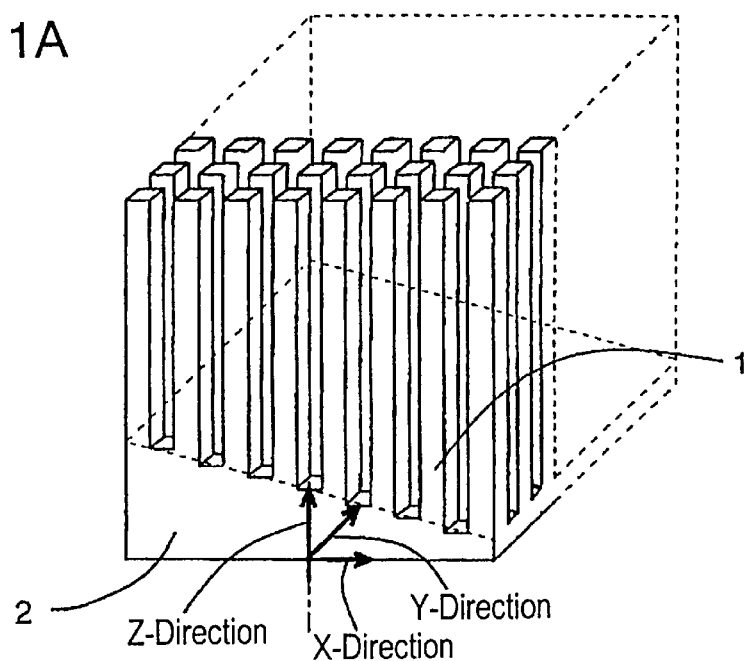
FIG. 1A through FIG. 1C are a perspective view of a main part, and a front view and a side view of a heat sink, respectively, in accordance with exemplary embodiment 1 of the present invention.
Figure 1B:
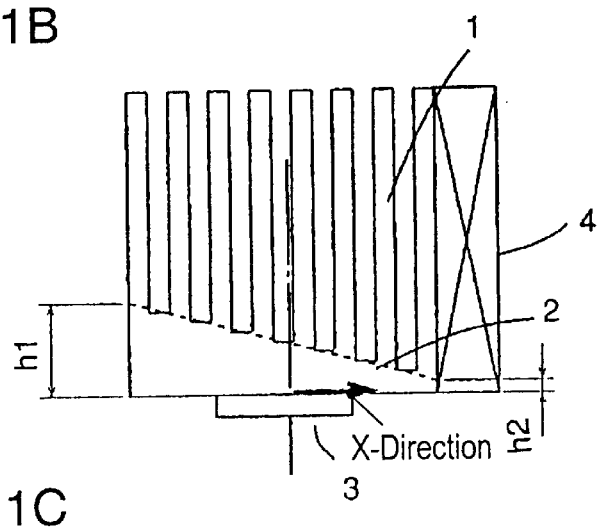
Figure 1C:
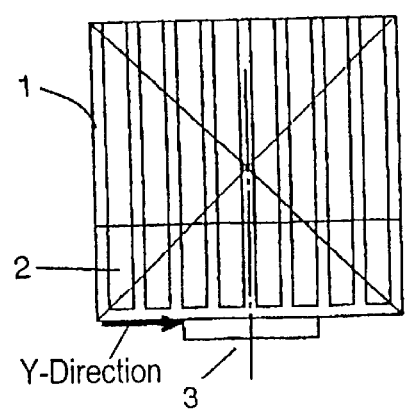
Figure 2A:
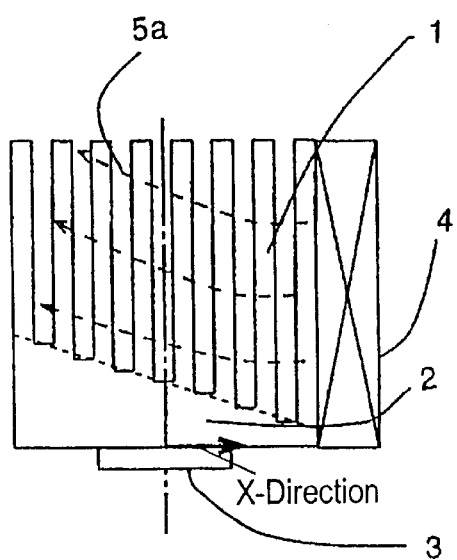
FIG. 2A through FIG. 2D are front views of cooling apparatuses in accordance with exemplary embodiment 1.
Figure 2B:
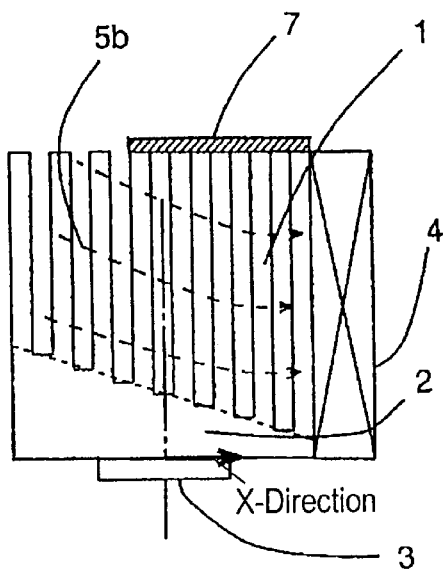
Figure 2C:
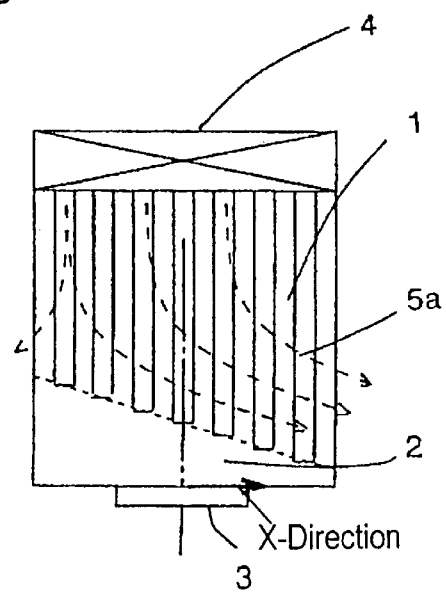
Figure 2D:
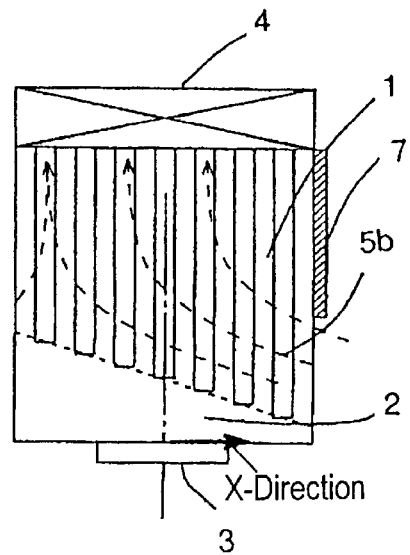
Figure 3A:
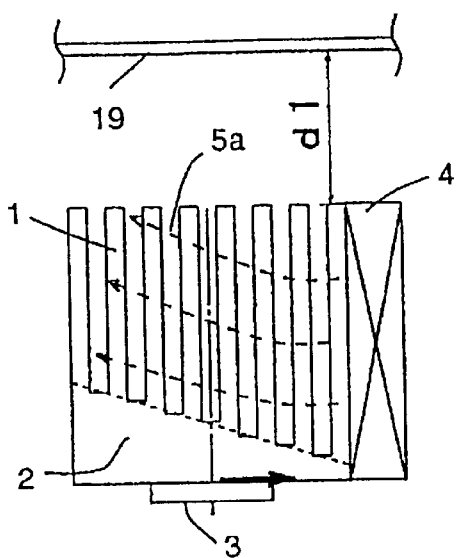
FIG. 3A through FIG. 3C are front views of the cooling apparatuses in accordance with exemplary embodiment 1 and a graph showing heat radiation performance of the apparatuses.
Figure 3B:
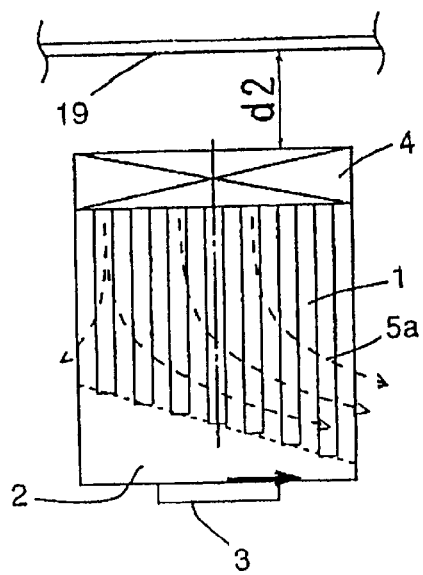
Figure 3C:
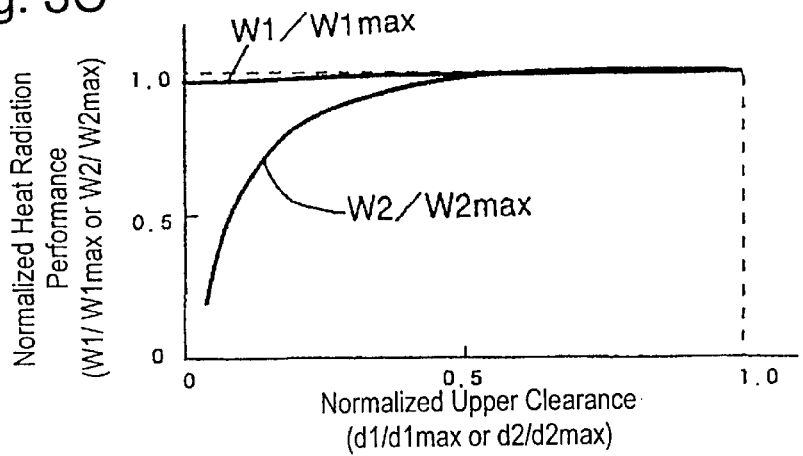

FIG. 1A is a perspective view of a main part of a heat sink in accordance with exemplary embodiment 1 of the present invention. FIG. 1B is a front view of the heat sink having a cooling fan in a view from the Y-direction of a heat conducting plate 2. FIG. 1C is a side view of the heat sink having a cooling fan, viewed in the X-direction of the heat conducting plate 2. FIG. 2A and FIG. 2B show a heat sink having a cooling fan 4 on a side thereof. FIG. 2C and FIG. 2D show a heat sink having a cooling fan 4 on an upper surface thereof. FIG. 3A and FIG. 3B are front views of cooling apparatuses including a blowing-type cooling fan 4 of exemplary embodiment 1 disposed on the side and the upper surface of the respective heat sinks. FIG. 3C is a graph showing a relation between a heat radiation performance and a distance between the heat sink and a component when an electric apparatus includes the component near the heat sink.

In FIG. 1A through FIG. 1C, a heat sink includes plural columnar fins 1 and a heat conducting plate 2 (heat conducting unit) for supporting the fins A heating element 3 is mounted under heat conducting plate 2 (in the negative Z-direction). The heating element 3 is an electronic component that generates heat, for example, a semiconductor such as an IC, LSI or MPU, or a transistor.

The width direction of the heat conducting plate 2 is the X-direction, the depth direction is the Y-direction, and the height direction is the Z-direction, as shown in FIGS. 1A–1C.

Generally in a heat radiator contacting a small heating element, heat from a heat receiving surface into an isotropic material tends to diffuse with a semispherical temperature distribution. A heat sink ideally including a semispherical heat conducting unit and many radiating fins that are formed radially around a heating element in the center of the heat conducting unit is considered to have the highest heat radiation performance. Such heat sink, however, has various problems despite the performance. The problems are, for example, a practically unavailable shape or size and extremely high manufacturing costs.

A heat conducting plate 2 of a heat sink in accordance with embodiment 1, as shown in FIG. 1B, is a trapezoid square pole having a cross section perpendicular to the depth direction (Y-direction) gradually increasing in thickness from thickness h2 to thickness h1. The heat conducting plate can realize a semispherical temperature distribution in a larger range than that of a plate-like heat conducting unit of the conventional heat sink. Heat from heating element 3 diffuses with the semispherical temperature distribution, and diffuses to columnar fins 1 functioning as heat radiating fins. The heat sink of embodiment 1 has a heat radiation performance higher than the conventional heat sink having the same size. Since one side part of the heat conducting plate 2 is thin, a cooling fan can be easily disposed on the side, namely, the side at the thickness h2, as shown in FIG. 1B and FIG. 1C. This heat sink can obtain sufficient airflow without disturbing airflow from the fan, which is different than the conventional tower-type heat sink shown in FIGS. 15A–15C. In the conventional heat sink, base plate 2b as a heat conducting unit disturbs airflow from a fan.

FIG. 2A and FIG. 2B show cooling apparatuses which have cooling fans on their sides as in FIG. 1B, but the cooling apparatuses of FIGS. 2A and 2B have different airflow directions through the heat sink. FIG. 2A shows a cooling apparatus employing a blowing fan, and FIG. 2B shows a cooling apparatus employing a suction fan. In FIG. 2A, airflow 5a supplied from the cooling fan 4 passes between columnar fins 1 to flow to the side of the heat sink opposite the cooling fan 4. In this manner, heat is conducted from the surface of each fin to the air and radiated. A part of the heat radiating surface having a higher temperature further contributes to the heat radiation. The high temperature part in a heat sink corresponds to a vicinity of a base of each fin where the heat conducting plate 2 joins each columnar fin 1. A high-performance heat sink therefore requires sufficient air to be guided to this vicinity. In the conventional heat sink having columnar fins on a simple planar plate, even if a cooling fan is disposed on a side of the heat sink, air passing between the fins inevitably tends to escape upwardly of the fins in an intermediate part of the heat sink due to fluid resistance between the fins. Sufficient air is not necessarily supplied to the vicinity at the base of the fins, especially on the side of the heat sink opposite cooling fan. In the heat sink in accordance with embodiment 1, therefore, the heat conducting plate 2 is thin at the side of the cooling fan and becomes thicker toward the side opposite the fan. The main stream of air supplied from the fan in this heat sink flows up the slope of the heat conducting plate 2. Airflow passing through the clearances at the bases of columnar fins 1 also flows adhesively without departing from the upper surface of the heat conducting plate 2. This heat sink thus can secure a larger amount of air that contributes to heat radiation to thereby provide higher heat radiation performance, FIG. 2B shows another cooling apparatus, which employs a suction fan. This cooling apparatus may include a shielding plate 7 on a heat sink. Air flows from the left surface and the upper left part of the heat sink. The air flows downwardly (negative Z-direction) from a part over the heat sink, and joins with the air from the left surface of the heat sink, and presses toward the surface of heat conducting plate 2. The main stream of airflow 5b into the cooling fan flows down the slope of heat conducting plate 2, so that this arrangement can also ensure a higher heat radiation performance.

FIG. 2C and FIG. 2D show other cooling apparatuses in accordance with embodiment 1 which have a cooling fan on the upper surface of a heat sink opposite to the heating element 3 and which have different airflow directions through the heat sink. FIG. 2C shows a cooling apparatus employing a cooling fan for blowing air to create airflow 5a. A main stream of the air flows down near the slope of the heat conducting plate, so that performance similar to that of the cooling apparatus shown in FIG. 2A can be expected. FIG. 2D shows a cooling apparatus employing a suction cooling fan mounted on the heat sink. A main stream of the airflow 5b in this cooling apparatus flows near the slope of the heat conducting plate, so that the apparatus is expected to have a similar performance to that of the cooling apparatus shown in FIG. 2B. The cooling apparatus shown in FIG. 2D requires that a shielding plate 7 similar to that in FIG. 1B is mounted on the heat sink at a thinner side of the heat conducting plate.

Figure 16A:
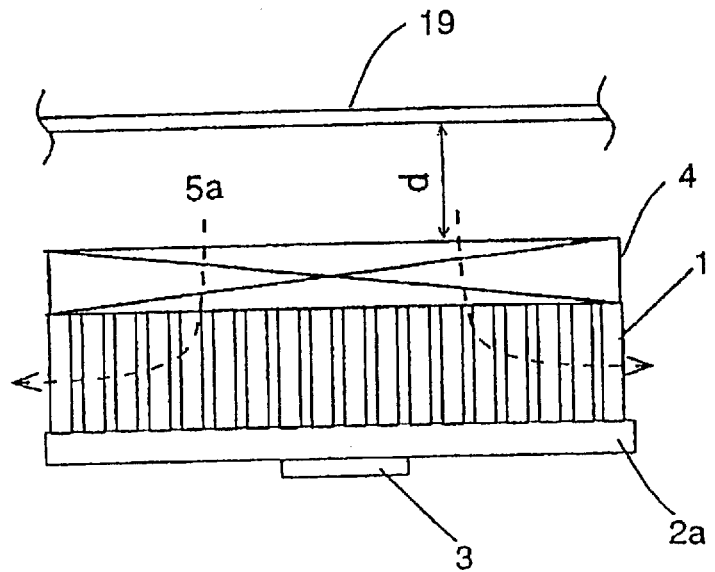
FIG. 16A and FIG. 16B are a front view of the conventional cooling apparatus shown in FIG. 14A through FIG. 14B, and a graph showing a heat radiation performance of the apparatus.
Figure 16B:
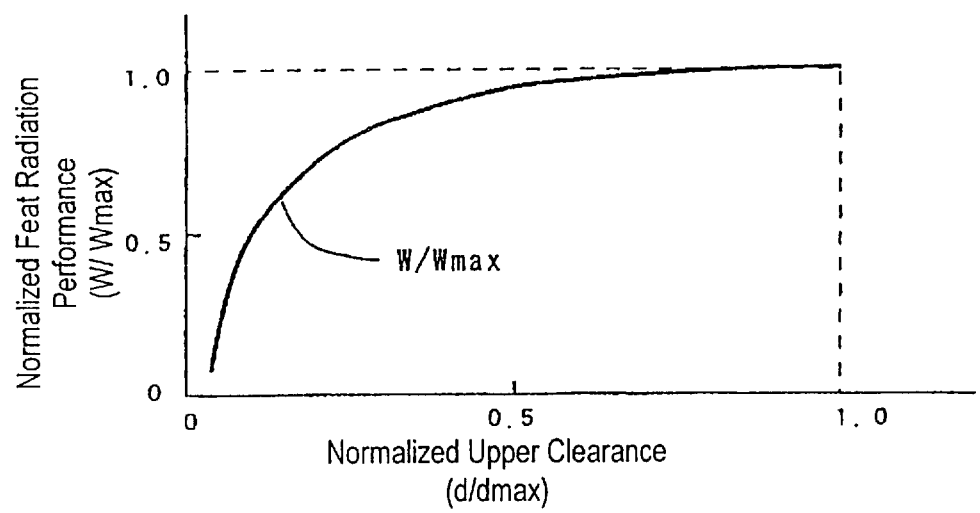

Additional structure is often disposed over a cooling fan in view of recent downsizing of electronic apparatus. Therefore, sufficient clearance (d) cannot necessarily be obtained over the fan. In FIG. 3A, a blowing fan 4 is disposed on a side of a heat sink, and additional structure 19 in the electronic apparatus is disposed over the heat sink. In FIG. 3B, a blowing fan is disposed on the upper surface of a heat sink opposite heating element 3, and additional structure 19 in the electronic apparatus is disposed over the heat sink. FIG. 3C is a graph showing normalized performance relative to distance (d) between the structure 19 and the cooling apparatus. The vertical axis of this graph represents a heat radiation performance ratio W/W max (normalized heat radiation performance), and the horizontal axis represents a ratio d/d max (normalized upper clearance) of the clearance over the fan, similarly to FIG. 16B, where W is heat radiation performance corresponding to the clearance (d) over the cooling fan, W max is a maximum heat radiation performance, which is obtained when heat radiation performance W becomes constant in relation to gradual increase of clearance (d) from zero, and d max is a clearance obtained at this time. A heat radiation performance ratio W1/W1 max and normalized upper clearance ratio d1/d1 max correspond to the heat sink shown in FIG. 3A. A heat radiation performance ratio W2/W2 max and normalized upper clearance ratio d2/d2 max correspond to the heat sink shown in FIG. 3B. The graph shows that the performance degrades when the clearance is decreased, similarly to the conventional heat sink of FIGS. 16A and 16B. That is because incoming airflow is restricted when the structure 19 exists on the air intake side of the cooling fan, such as for the cooling apparatus shown in FIG. 3B. The performance degradation cannot be avoided because a clearance through which air over the fan flows is restricted. Whereas, in the cooling apparatus shown in FIG. 3A, performance is degraded only a little, and a higher heat radiation performance is maintained. That is because incoming airflow to the fan is hardly restricted in this apparatus even when the structure is close to or contacts with the upper part of the heat sink.

The heat conducting plate 2 of embodiment 1 has a trapezoidal cross section. However, a plate having a cross section of gradually increasing thickness from one end to another end, as well as the trapezoidal cross section, provides the same effect.

(Exemplary Embodiment 2)

Figure 4A:
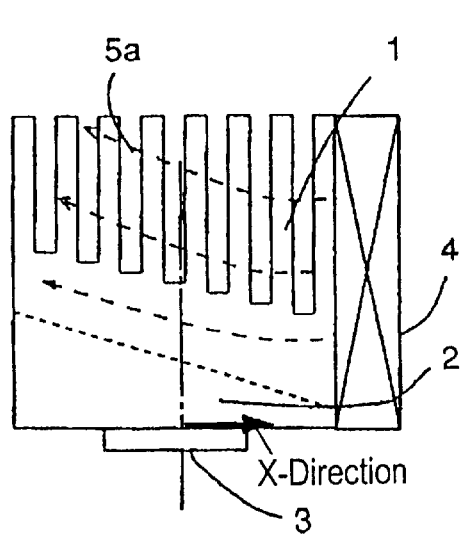
FIG. 4A through FIG. 4D are front views of cooling apparatuses in accordance with exemplary embodiment 2 of the present invention.
Figure 4B:
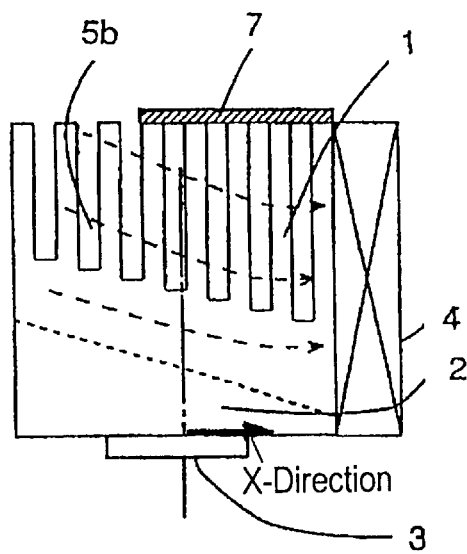

FIG. 4A and FIG. 4B are front views of cooling apparatuses in accordance with exemplary embodiment 2 of the present invention. A heat sink in accordance with exemplary embodiment 2 has slits formed in two directions, namely the X-direction and the Y-direction, between columnar fins. The first slits formed in the Y-direction are deeper than the second slits formed in the X-direction.

FIG. 4A and FIG. 4B show cooling apparatuses having a blowing fan and a suction fan on sides of heat sinks, respectively. Regarding the shape of the heat sink, the second slits determine the direction of the airflow velocity. In other words, most of the air flows in the direction of the second slits. Fins at which the temperature rises most, (i.e. the fins near directly above the part of the heat conducting plate) have a larger cross section and higher thermal conductivity than simple columnar fins 1. The fins can efficiently conduct heat from the heat conducting plate 2 to the columnar fins in the upper part having a larger surface area, thereby radiating the heat efficiently. The cooling apparatus employing the suction fan as shown in FIG. 4B can realize the same performance as that in FIG. 4A by employing shielding plate 7 similarly to FIG. 2B.

Figure 4C:
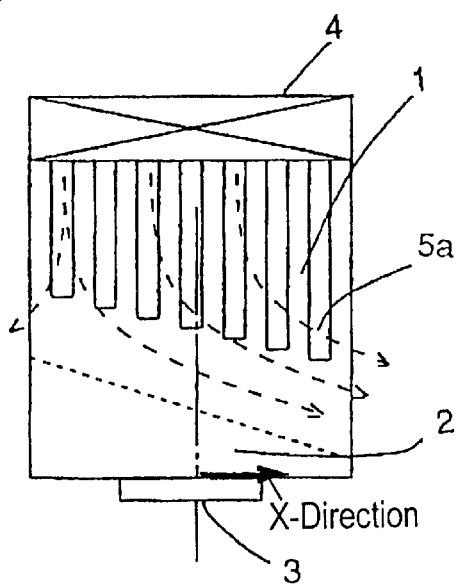
Figure 4D:
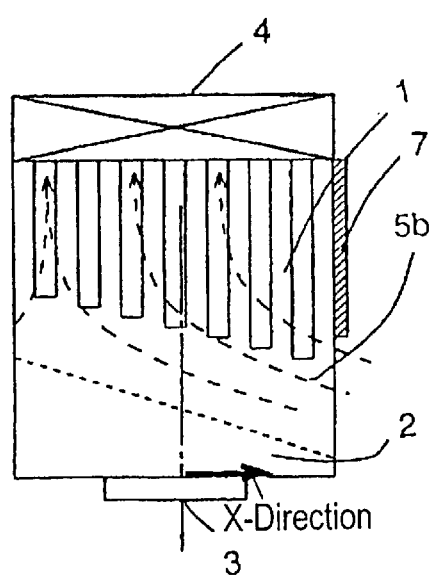

FIG. 4C and FIG. 4D show cooling apparatuses having a blowing fan and a suction fan on the upper surfaces of heat sinks having the same shapes as those in FIG. 4A and FIG. 4B, respectively. The cooling apparatuses can also essentially exert the same level of performance as the cooling apparatuses shown in FIG. 4A and FIG. 4B, if additional structure of an electronic apparatus does not exist closely above the cooling fans.

Figure 5A:
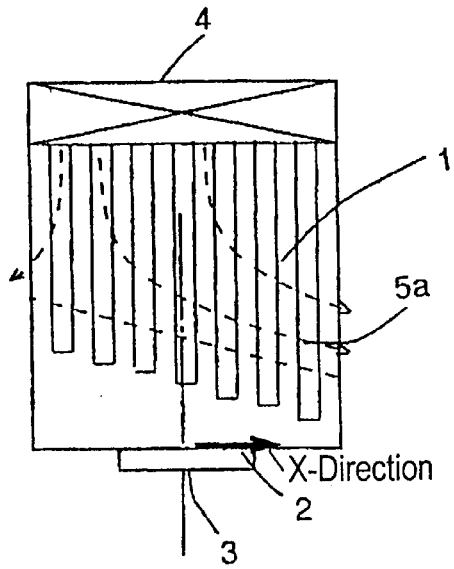
FIG. 5A through FIG. 5D are front views and side views of other cooling apparatuses in accordance with exemplary embodiment 2.
Figure 5C:
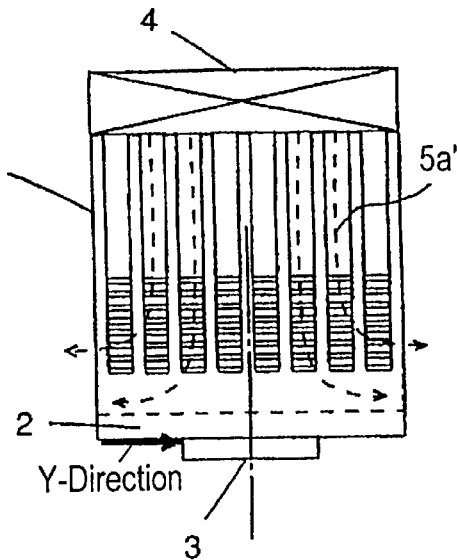
Figure 5B:
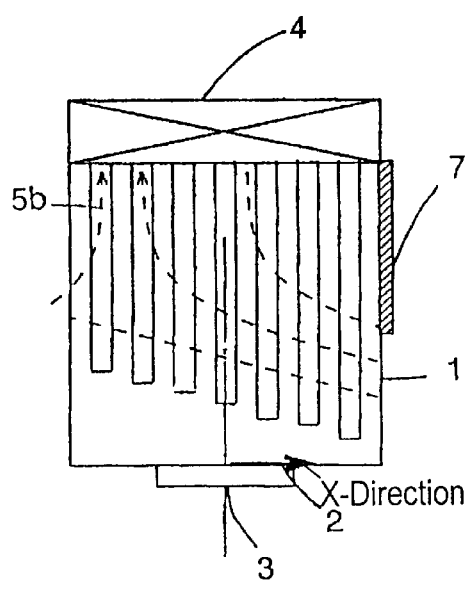
Figure 5D:
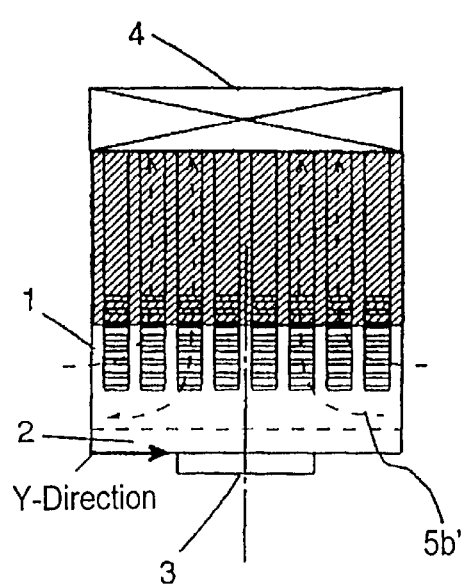

FIG. 5A shows a cooling apparatus having a blowing fan on the upper surface of a heat sink, wherein the heat sink has second slits formed in the X-direction that are shallower than first slits formed in the Y-direction. In a region directly-above the heat conducting plate 2, the direction (Y-direction) of plate-like fins formed by the deeper first slits provides an airflow 5a'. In the columnar fin part of the heat sink further above the conducting plate 2, air flows in two directions including an airflow 5a and airflow 5a'. The airflow 5a can be especially expected to enhance heat radiation performance because turbulence occurs on a stepped part of each of the first slits. FIG. 5B shows a cooling apparatus having a suction fan on the upper surface of the heat sink. In a region directly-above the heat conducting plate 2, air flows in the direction (Y-direction) of plate-like fins formed by the deeper first slits to provide an airflow 5b'. The airflow 5b' joins with an airflow 5b in the columnar fin part further above the heat conducting plate 2. The airflow 5b especially enhances heat radiation performance because turbulence occurs on a stepped part of each of the first slits similarly to the cooling apparatus shown in FIG. 5A. The cooling apparatus employing the suction fan as shown in FIG. 5B can exhibit the same performance as that in FIG. 5A by employing a shielding plate 7 similarly to FIG. 4B.

Figure 6A:
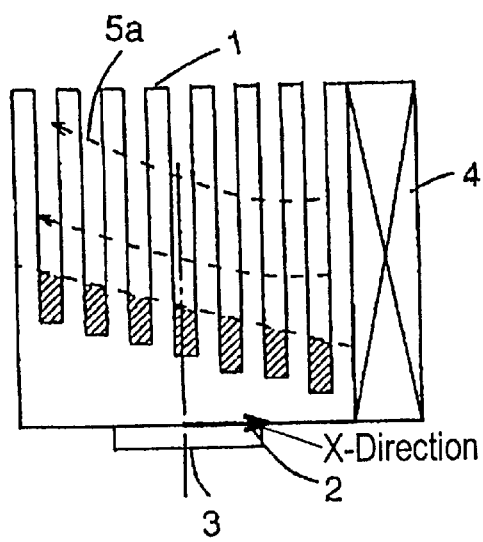
FIG. 6A through FIG. 6D are front views and side views of other cooling apparatuses in accordance with exemplary embodiment 2.
Figure 6C:
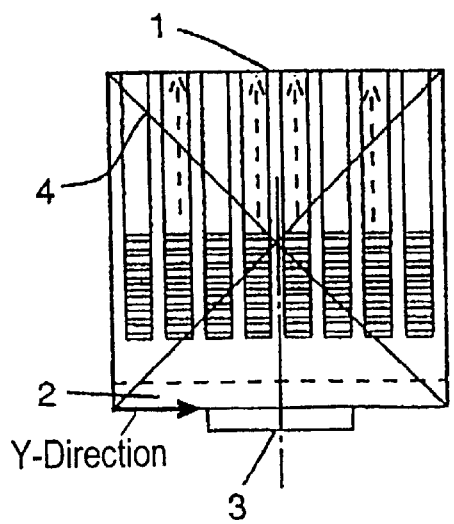
Figure 6B:
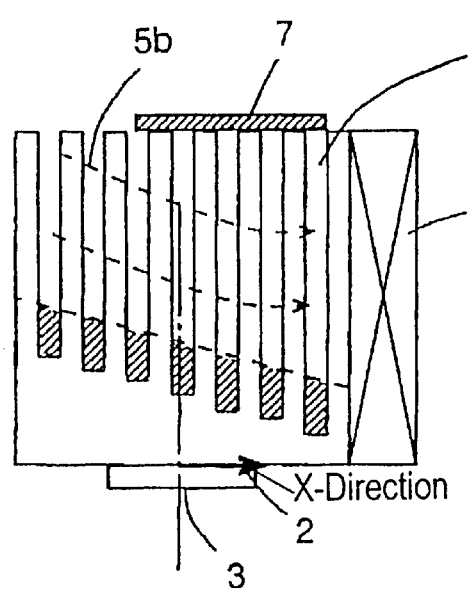
Figure 6D:
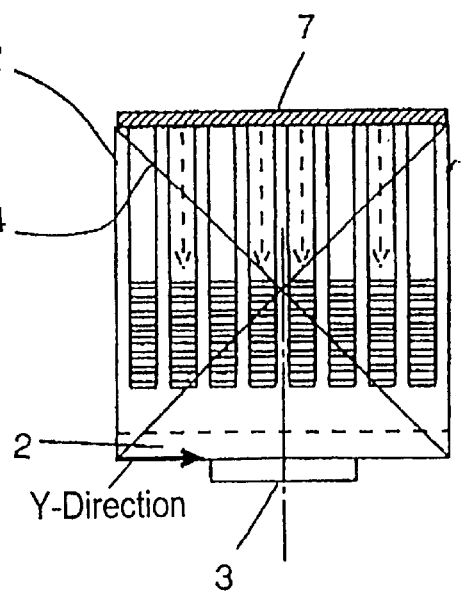

This type of heat sinks does not exert good performance in all structures. Cooling apparatuses shown in FIG. 6A and FIG. 6B have a cooling fan on a side of the heat sink with the first slits being shallower than the second slits as shown in FIG. 5A and FIG. 5B. Regardless of whether the apparatus employ a blowing fan or a suction fan, they may not exhibit the same sufficient performance as the cooling apparatuses shown in FIG. 1A through FIG. 5B. In the cooling apparatuses shown in FIG. 6A and FIG. 6B, air supplied from the cooling fan mainly flows through the second slits. The air therefore stagnates in grooves (oblique line parts in FIG. 6A and FIG. 6B) formed with the first slits in the region directly-above the heat conducting plate 2, and hardly goes out of the heat sink. Therefore, the apparatus may exhibit a little less sufficient heat radiation performance.

(Exemplary Embodiment 3)

Figure 7A:
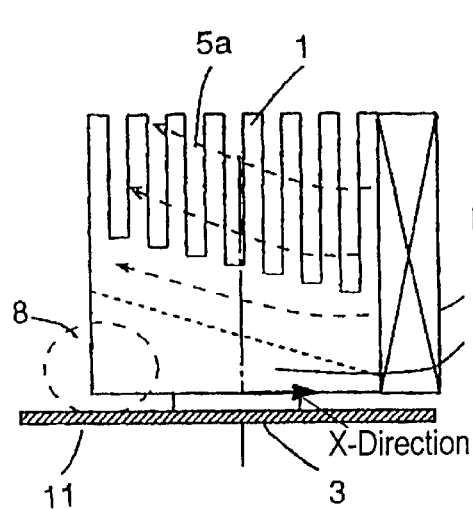
FIG. 7A through FIG. 7D are front views of cooling apparatuses in accordance with exemplary embodiment 3 of the present invention.
Figure 7B:
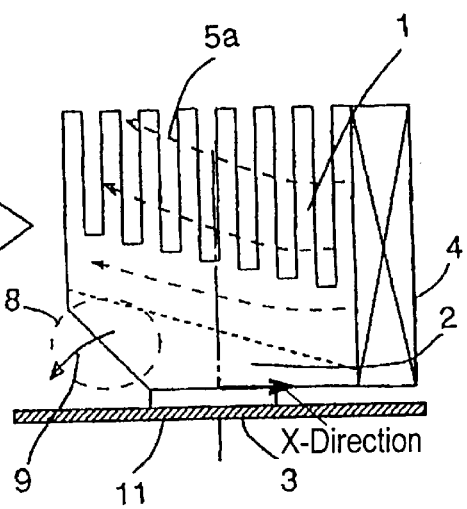
Figure 7C:
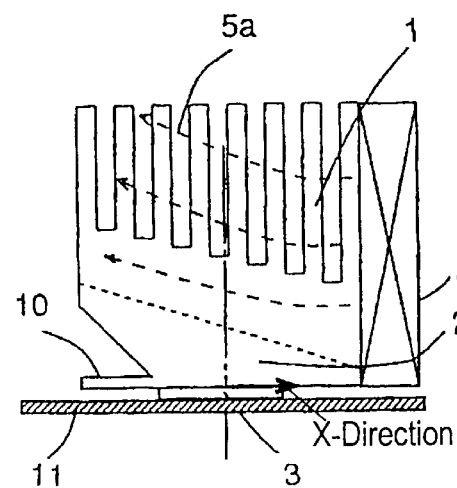
Figure 7D:
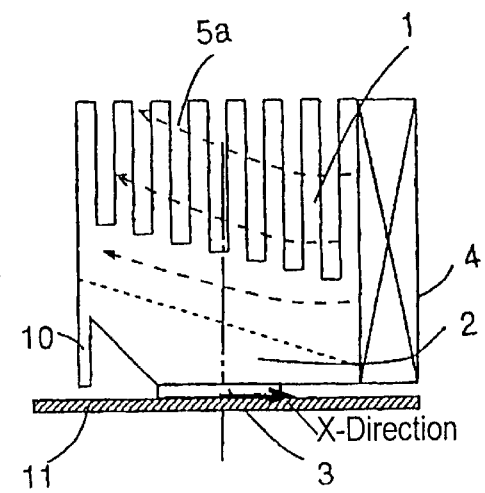

FIG. 7A and FIG. 7D are front views of cooling apparatuses in accordance with exemplary embodiment 3 of the present invention. FIG. 7A shows a cooling apparatus including a heat conducting plate having a shape with a thickness gradually increasing from one side to another side in a cross section perpendicular to a heat receiving surface, and a blowing fan, which is the same as that in FIG. 4A, disposed on a heat sink having second slits in the X-direction deeper than first slits in the Y-direction. The heat conducting plate 2 shown in FIG. 7A having an edge part 8, i.e., a thicker part, exhibits a high thermal diffusing effect, so that a higher heat radiation performance can be expected. The heat conducting plate 2, however, becomes heavier as the thickness of the edge part 8 increases. The edge part 8 hardly contributes the heat radiation performance, because the edge part 8 receives heat, but has insufficient surface area for radiating the heat. The heat sink can be lightened with little performance degradation by cutting a portion of the edge part 8 at a predetermined inclination angle as shown in FIG. 7B. The inclination angle is simply determined using a line between a position of a base of the radiating fin farthest from the center of a heating element and a position at the shortest distance from the heating element.

FIG. 7C and FIG. 7D show other heat sinks in accordance with embodiment 2. Each heat sink include a tilt-preventing plate 10 for preventing the heat sink shown in FIG. 7B from tilting as a whole in a tilting direction 9 when the heat sink receives an external force in an electronic apparatus. The heat sink having the edge part 8 as shown in FIG. 7A, generally, does not largely tilt even if the whole electronic apparatus tilts due to the external force. That is because the heat sink contacts with a board 11 of a heating element (MPU) at this moment. When the edge part 8 is removed for lightening the heat sink as shown in FIG. 7B, the entire heat sink may tilt, and therefore, the heating element 3 may be broken, or the heat sink may separate from the heating element to damage the inside of the electronic apparatus. The tilt-preventing plate 10 shown in FIG. 7C and FIG. 7D allows the heat sink to be lightened without performance degradation as shown in FIG. 7B, and to be prevented from tilting or overturning.

(Exemplary Embodiment 4)

Figure 8A:
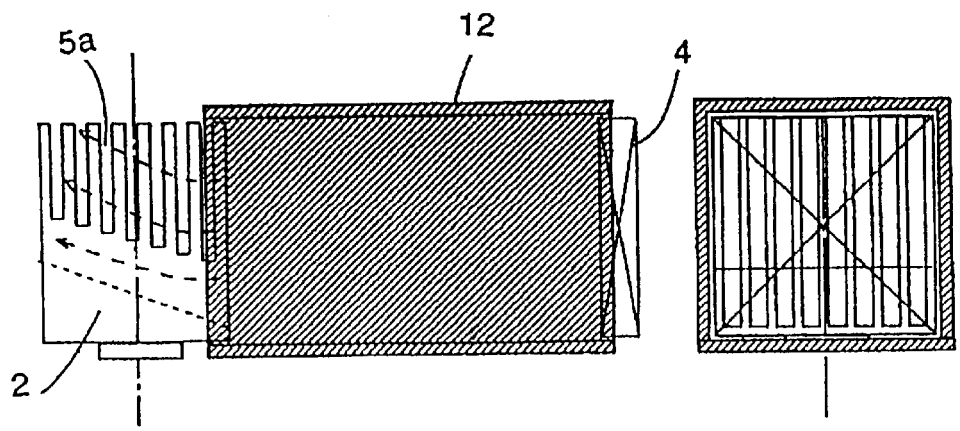
FIG. 8A and FIG. 8B are front views and FIG. 8C and FIG. 8D are side views of cooling apparatuses in accordance with exemplary embodiment 4 of the present invention.
Figure 8C:
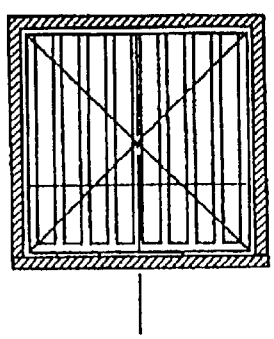
Figure 8B:
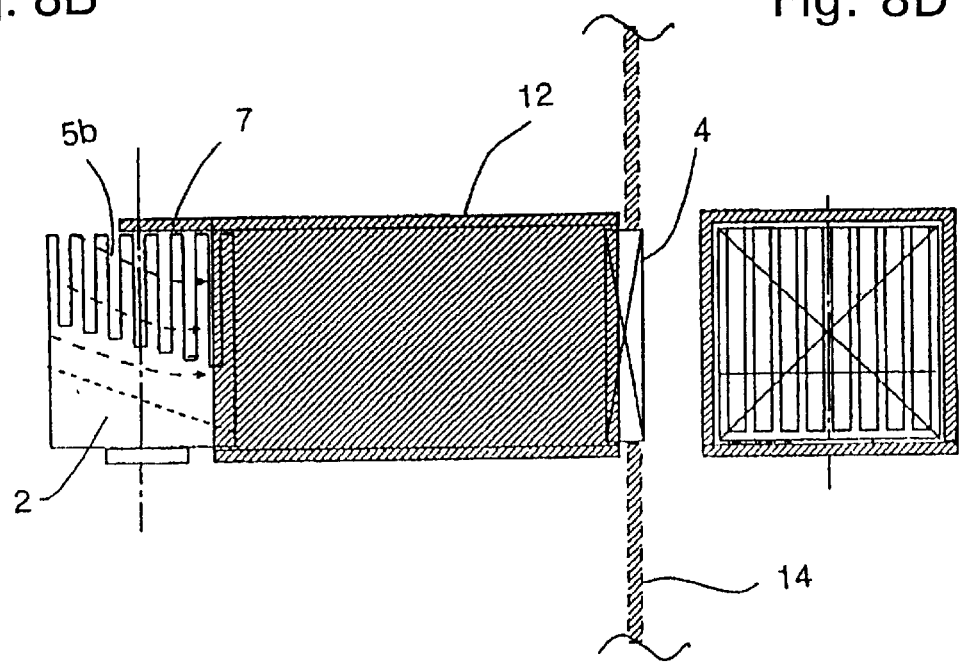
Figure 8D:
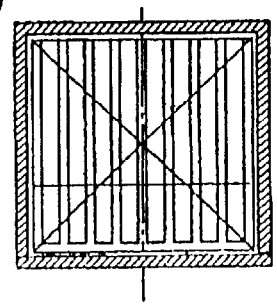

FIG. 8A and FIG. 8B are front views and FIG. 8C and FIG. 8D are side views of cooling apparatuses in accordance with exemplary embodiment 4 of the present invention. FIG. 9A and FIG. 9B are front views and FIG. 9C and FIG. 9D are side views of other cooling apparatuses in accordance with exemplary embodiment 4. Each of the cooling apparatuses includes a heat sink having a heat conducting plate 2 with a thickness that gradually increases from one end to another end in the cross section perpendicular to a heat receiving surface and having second slits extending in the increasing direction of thickness that are deeper than first slits extending in the other direction, and a cooling fan disposed in communication with the cooling apparatus through a duct.

FIG. 8A through FIG. 8D show cooling apparatuses including a blowing fan and a suction fan disposed on sides of heat sinks and communicated therewith through straight ducts 12, respectively. Each cooling apparatus can easily employ the cooling fan spaced away from the heat sink. Especially in FIGS. 8B and 8D, the blowing fan is disposed on wall surface 14 of a case of an electronic apparatus, and is coupled with the heat sink through duct 12. In this case, heat radiated from the heat sink is discharged directly to the outside with little diffusion in the electronic apparatus.

Residual heat in the apparatus can thus be suppressed in order to maintain stable operation of the electronic apparatus.

FIG. 9A through FIG. 9D, similarly to FIG. 8A through FIG. 8D, show cooling apparatuses including a blowing fan and a suction fan communicated with the surfaces of heat sinks through bent ducts 13, respectively. Each cooling apparatus can also easily employ the cooling fan spaced away from the heat sink. The cooling apparatus shown in FIGS. 9B and 9D exhibits the same effect as the cooling apparatus shown in FIGS. 8B and 8D. In other words, the cooling apparatus shown in FIGS. 9B and 9D does not leave heat in the electronic apparatus and can directly discharge heat to the outside. This cooling apparatus is useful for maintaining a stable operation of the electronic apparatus, especially where residual heat presents a problem.

The cooling fans in embodiment 1 through embodiment 4 can be mounted with screws, adhesives, clips, or belts. The cooling apparatuses in embodiment 1 through embodiment 4 employ the cooling fans, but may employ heat-exchanging elements such as Peltier elements. Heat of a heat sink may be guided to other positions through a heat pipe or the like to cool the electronic apparatus.

Figure 14A:
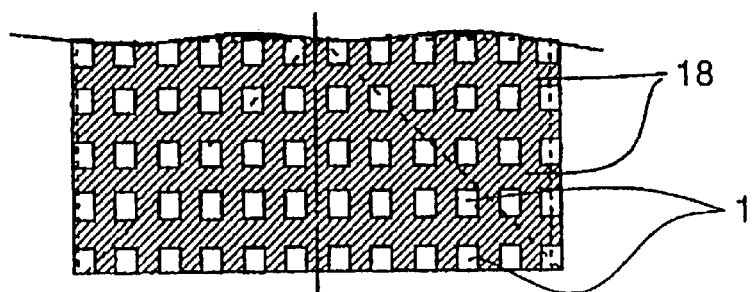
FIG. 14A is a top view and FIGS. 14B and 14C are front views of conventional cooling apparatuses.
Figure 14C:
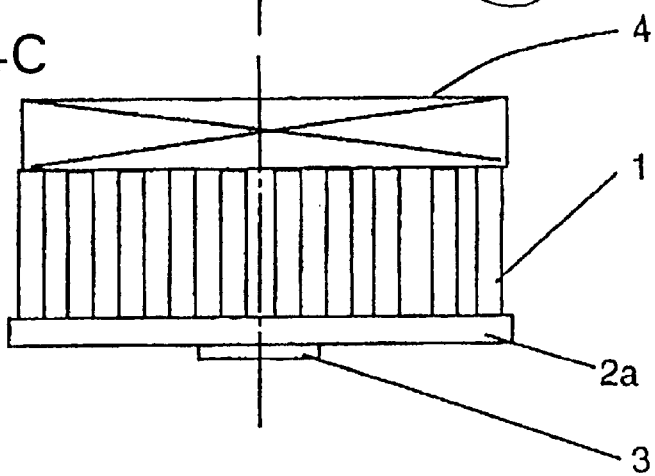
Figure 14B:
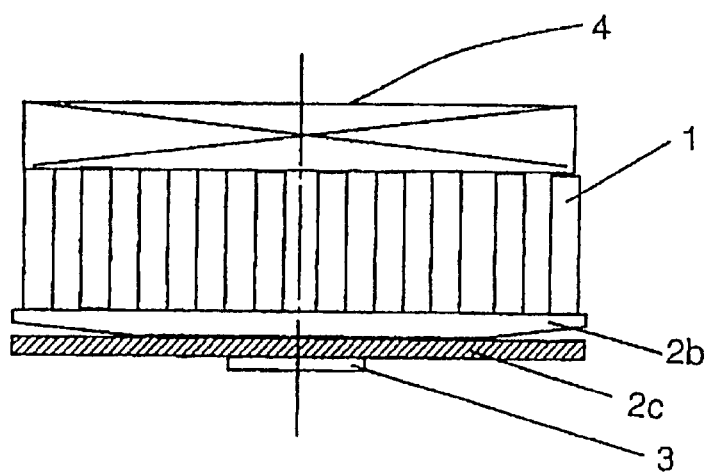

Additionally, a plate the same as the thermal diffusion plate 2c used in the conventional cooling apparatus shown in FIG. 14B may be disposed between a heating element and the heat receiving surface of a heat sink.

(Exemplary embodiment 5)

Figure 10A:
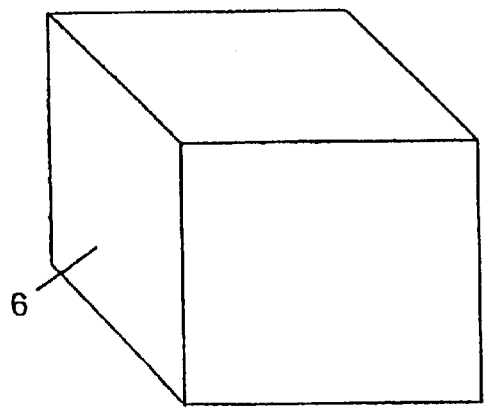
FIG. 10A through FIG. 10C are perspective views for illustrating a method of manufacturing the heat sinks in accordance with exemplary embodiments 1 and 2.
Figure 10B:
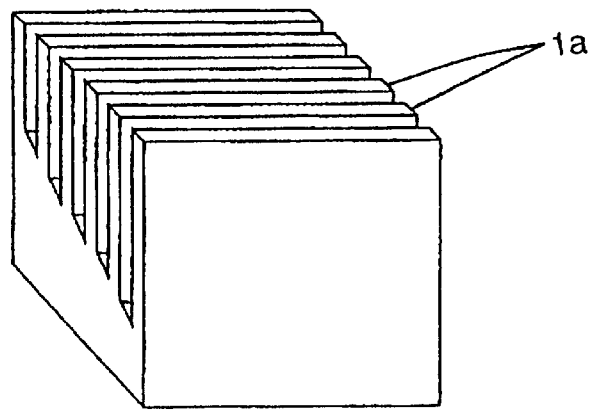
Figure 10C:
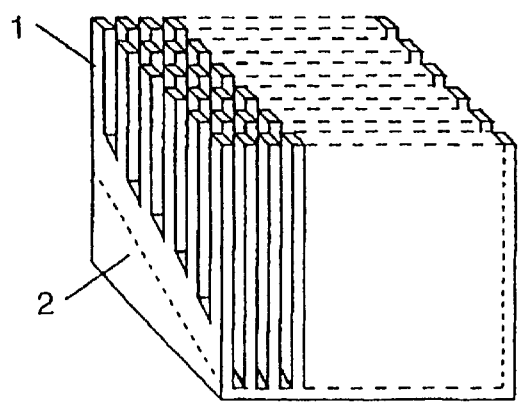
Figure 11A:
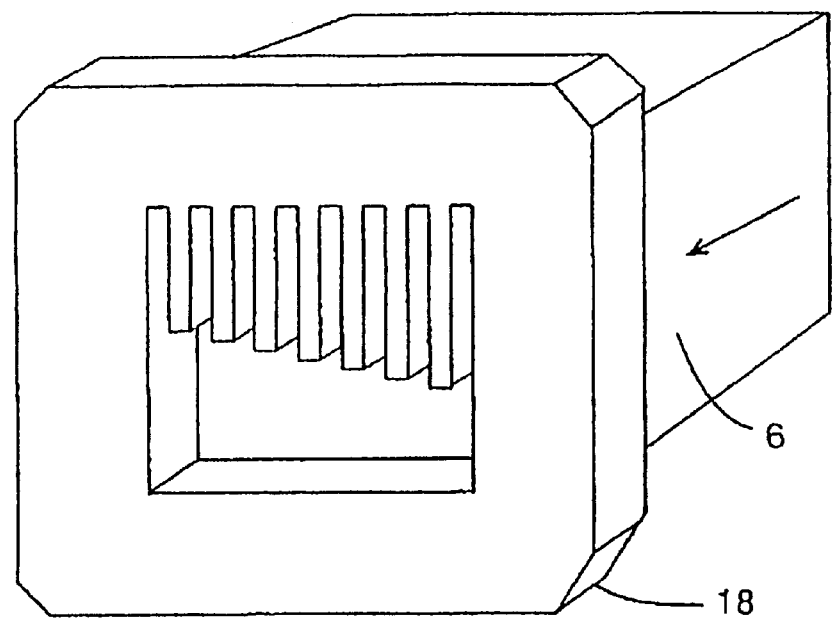
FIG. 11A and FIG. 11B are perspective views for illustrating an extrusion process in the method of manufacturing the heat sinks in accordance with exemplary embodiments 1 and 2.
Figure 11B:
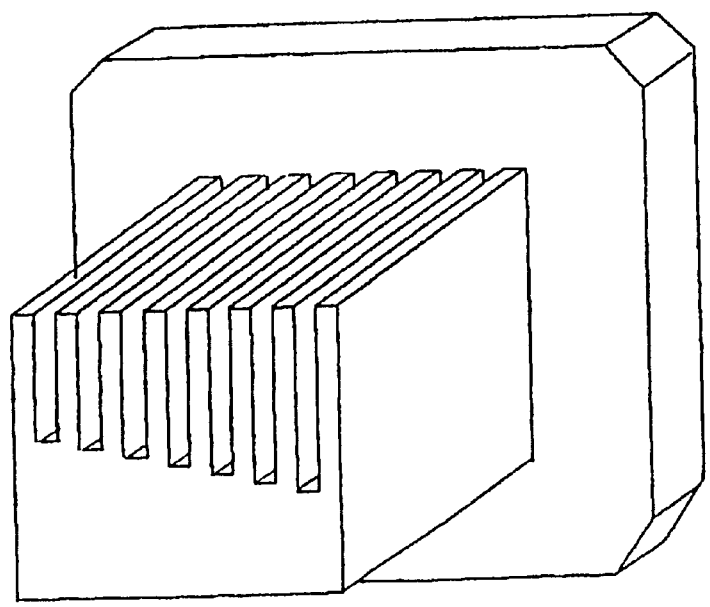
Figure 12A:
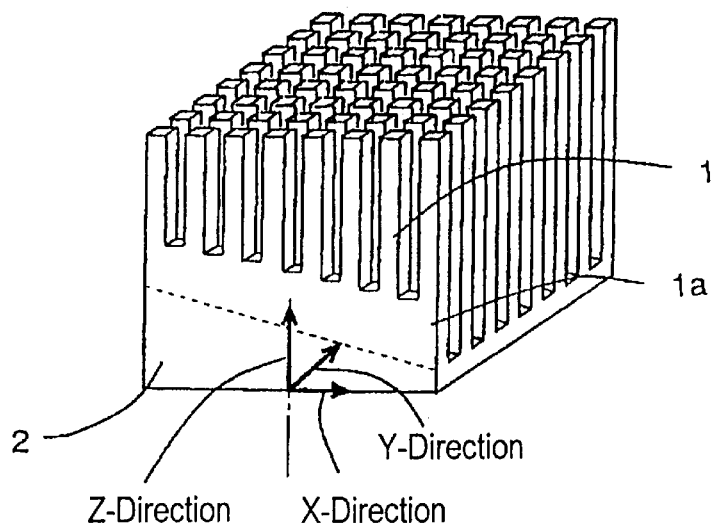
FIG. 12A and FIG. 12B are a perspective view of each heat sink in accordance with exemplary embodiments 1 and 2, and a schematic diagram of a cutting process in the manufacturing method of the heat sink.
Figure 12B:
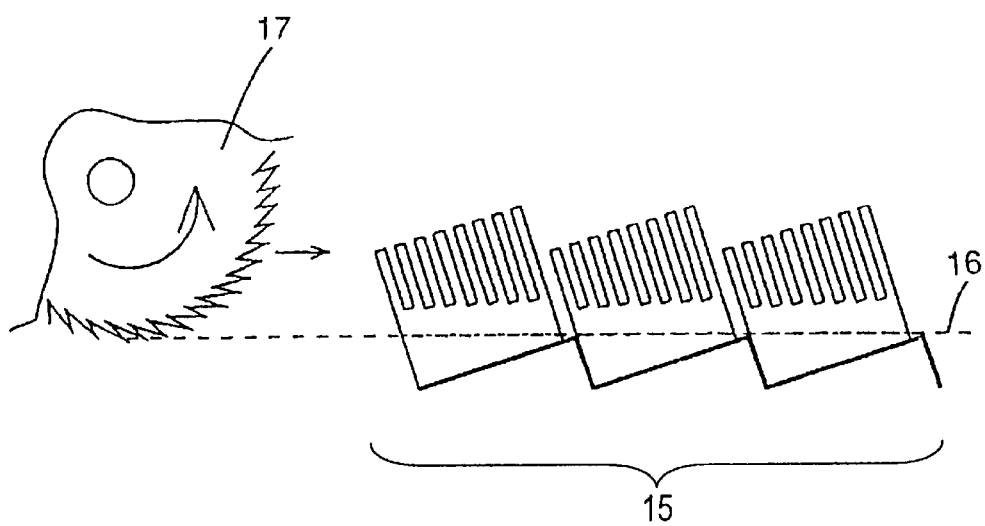
Figure 13A:
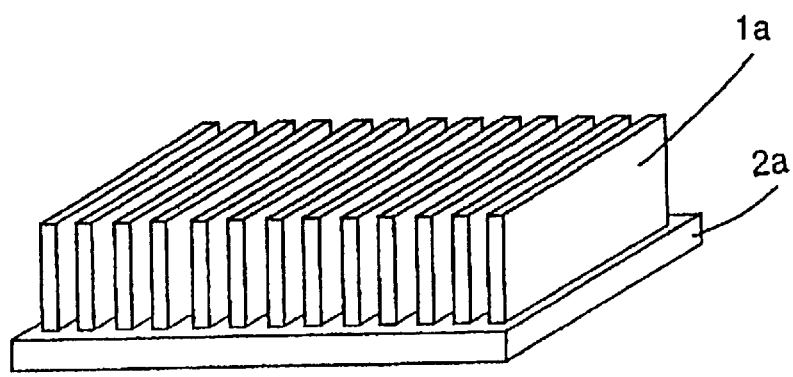
FIG. 13A and FIG. 13B are perspective views of conventional heat sinks.
Figure 13B:
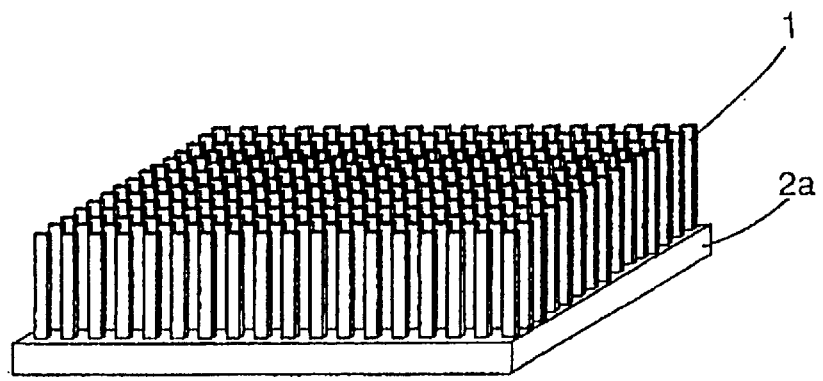

FIG. 10A through FIG. 10C are perspective views for illustrating a manufacturing method of the heat sinks in accordance with exemplary embodiments 1 and 2. FIG. 11A and FIG. 11B are perspective views for illustrating an extrusion process used in the measuring method of the heat sinks. FIG. 12A and FIG. 12B are a perspective view of the heat sinks, and a front view of the heat sinks fixed to a jig in a cutting process in the manufacturing method, respectively.

FIG. 10A shows an initial state of a heat conductive material 6. FIG. 10B shows a first process, in which a heat conducting plate 2 and plural plate fins 1a in the longitudinal direction of the heat conducting plate 2 are simultaneously formed by cutting, extrusion, or drawing. FIG. 10C shows a second process of forming slits perpendicularly to the longitudinal direction of plate fins a. In this process, plural columnar fins 1 are formed on the upper surface of the heat conducting plate to manufacture a heat sink.

The first process using the extrusion molding is hereinafter illustrated, though any of the cutting, the extrusion, and the drawing can be applied to the material in the process. FIG. 11A shows a high-temperature heat conductive material 6 pressed onto a die 18 for extrusion molding in the arrow direction shown in FIG. 11A. In FIG. 11B, the heat conductive material 6 is plastically deformed into the same shape as that of a mold cavity of the die, and pressed out. At this time, the heat conducting plate 2 and plate fins 1a shown in FIG. 10B are simultaneously formed. Grooves between plate-like fins 1a form first slits. The material is cut to a predetermined length by a cutting tool, thereby finishing the first process.

In the second process, a heat sink having many columnar fins 1 as shown in FIG. 12A is formed by cutting. A heat sink having second slits deeper than first slits will be hereinafter illustrated. Heat conducting plates 2 are arranged on angled jig 15 in parallel, and the second slits in the upper parts of plural heat sinks are simultaneously cut by a cutting tool 17 as shown in FIG. 12B. A cutting line 16 (a cutting depth of the cutting tool 17) of the second slits is made deeper than the first slits as shown FIG. 12B, thereby forming stepped parts in the direction of the first slits. Turbulence occurs in fluid flowing in this direction, so that a heat sink having a higher heat radiation performance can be easily manufactured. When the cutting line 16 for the second slits is made shallower than the first slits (not shown), the stepped parts are formed in the direction of the second slits. A heat sink for generating turbulence, which improves heat radiation performance, in fluid flowing in this direction can be easily manufactured. After the forming of the fins, alumite coating is applied to the heat sink.

A small and high-performance heat sink having many columnar fins 1 can be manufactured efficiently at low cost.

The heat sink has a surface coated with an oxide layer by the alumite coating, which enhances anti-rust performance against an external environment, and thereby contributes to improved reliability. The coating also enhances thermal radiation capacity to improve heat radiation performance.

What is claimed is:

1. A heat sink for radiating heat generated by a heating element, comprising:

a heat conducting plate having a heat receiving surface for facing the heating element, said heat conducting plate having a thickness increasing from a first end of said heat receiving surface to a second end opposite to said first end in a cross section perpendicular to said heat receiving surface; and a plurality of fins disposed on an upper surface of said heat conducting plate and being non-parallel with said heat receiving surface, said upper surface being opposite to said heat receiving surface of said heat conducting plate;

wherein a first slit crossing a direction from said first end to said second end of said heat receiving surface and a second slit along the direction from said first end to said second end of said heat receiving surface are formed between said fins; and wherein, in said heat conducting plate, a part on which one of said first slit and said second slit is formed is thinner than a part on which the other of said first slit and said second slit is formed.

2. A heat sink according to claim 1, wherein, in said heat conducting plate, a part on which said second slit is formed is thinner than a part on which said first slit is formed.

3. A heat sink according to claim 1, wherein, in said heat conducting plate, a part on which said first slit is formed is thinner than a part on which said second slit is formed.

4. A heat sink according to claims 1, wherein a vicinity of a crossing corner between a side surface of said heat conducting plate and said heat receiving surface is cut, said side surface lying on said second end of said heat receiving surface.

5. A heat sink according to claim 4, further comprising a plate extending from said side surface of said heat conducting plate toward said heat receiving surface.

6. A heat sink according to claim 4, further comprising a plate extending in a direction along said heat receiving surface from said second end of said heat receiving surface toward said side surface of said heat conducting plate.

7. A heat sink according to claim 1, further comprising an oxide layer formed on said heat conducting plate and said fins.

8. A cooling apparatus including a heat sink according to claim 1, and further comprising a cooling device coupled with said heat sink.

9. A cooling apparatus according to claim 8, wherein said cooling device is mounted to a surface opposite to said heat receiving surface of said heat sink.

10. A cooling apparatus according to claim 8, wherein said cooling device is mounted to a side surface of said heat conducting plate, said side surface lying on said first end of said heat receiving surface.

11. A cooling apparatus according to claim 10, further comprising a shielding plate disposed on a surface of said heat sink opposite to said heat receiving surface, said shielding plate being disposed at a side where said cooling device is disposed.

12. A cooling apparatus according to claim 8 wherein, in said heat conducting plate, a part on which said second slit of said heat sink is formed is thinner than a part on which said first slit is formed.

13. A cooling apparatus according to claim 8, wherein, in said heat conducting plate, a part on which said first slit is formed is thinner than a part on which said second slit is formed.

14. A cooling apparatus according to claim 8, further comprising an oxide layer formed on said heat sink.

15. A cooling apparatus according to claim 8, further comprising a duct disposed between said cooling device and said heat sink.

16. A cooling apparatus according to claim 8 further comprising a heat diffusion plate disposed on said heat receiving surface.

17. A heat sink for radiating heat generated by a heating element, comprising:

a heat conducting plate having a heat receiving surface for facing the heating element, said heat conducting plate having a thickness increasing from a first end of said heat receiving surface to a second end opposite to said first end in a cross section perpendicular to said heat receiving surface; and a plurality of fins disposed on an upper surface of said heat conducting plate and being non-parallel with said heat receiving surface, said upper surface being opposite to said heat receiving surface of said heat conducting plate;

wherein a vicinity of a crossing corner between a side surface of said heat conducting plate and said heat receiving surface is cut, said side surface lying on said second end of said heat receiving surface.

18. A heat sink according to claim 17, further comprising a plate extending from said side surface of said heat conducting plate toward said heat receiving surface.

19. A heat sink according to claim 17, further comprising a plate extending in a direction along said heat receiving surface from said second end of said heat receiving surface toward said side surface of said heat conducting plate.

20. A heat sink according to claim 17, further comprising an oxide layer formed on said heat conducting plate and said fins.

21. A cooling apparatus including a heat sink according to claim 17, and further comprising a cooling device coupled with said heat sink.

22. A cooling apparatus according to claim 21, wherein said cooling device is mounted to a surface opposite to said heat receiving surface of said heat sink.

23. A cooling apparatus according to claim 21, wherein said cooling device is mounted to a side surface of said heat conducting plate, said side surface lying on said first end of said heat receiving surface.

24. A cooling apparatus according to claim 23, further comprising a shielding plate disposed on a surface of said heat sink opposite to said heat receiving surface, said shielding plate being disposed at a side where said cooling device is disposed.

25. A cooling apparatus according to claim 21, further comprising an oxide layer formed on said heat sink.

26. A cooling apparatus according to claim 21, further comprising a duct disposed between said cooling device and said heat sink.

27. A cooling apparatus according to claim 21, further comprising a heat diffusion plate disposed on said heat receiving surface.

28. A cooling apparatus according to claim 21, wherein said heat sink further includes a plate extending from said side surface of said heat conducting plate toward said heat receiving surface.

29. A cooling apparatus to claim 21, wherein said heat sink further includes a plate extending from said second end of said heat receiving surface toward said side surface of said heat conducting plate.

* * * * *